(12) United States Patent
Lin (10) Patent No.: US 8,778,754 B2
(45) Date of Patent: Jul. 15, 2014

(54) METHOD OF FORMING A SINGLE METAL THAT PERFORMS N AND P WORK FUNCTIONS IN HIGH-K/METAL GATE DEVICES

(75) Inventor: Su-Horng Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 143 days.

(21) Appl. No.: 12/364,289

(22) Filed: Feb. 2, 2009

(65) Prior Publication Data

US 2010/0065914 A1    Mar. 18, 2010

Related U.S. Application Data

(60) Provisional application No. 61/096,989, filed on Sep. 15, 2008.

(51) Int. Cl.
*H01L 21/8238* (2006.01)

(52) U.S. Cl.
USPC ........... 438/233; 438/218; 438/219; 257/369; 257/E21.635; 257/E21.636; 257/E21.637; 257/E29.154; 257/E29.158; 257/E29.159

(58) Field of Classification Search
USPC ........... 257/369, E21.635, E21.636, E21.637, 257/E29.154, E29.158, E29.159; 438/218, 438/219, 233
See application file for complete search history.

(56) References Cited

U.S. PATENT DOCUMENTS

| | | | |
|---|---|---|---|
| 6,291,282 B1 | 9/2001 | Wilk et al. | |
| 6,831,343 B2 | 12/2004 | Hu | |
| 6,835,639 B2 | 12/2004 | Rotondaro et al. | |
| 7,033,888 B2 | 4/2006 | Pan et al. | |
| 7,226,826 B2 | 6/2007 | Alshareef et al. | |
| 7,338,865 B2* | 3/2008 | Murto et al. | 438/275 |
| 7,368,796 B2 | 5/2008 | Hu | |
| 2004/0071879 A1* | 4/2004 | Callegari et al. | 427/255.28 |
| 2005/0009358 A1* | 1/2005 | Choi et al. | 438/706 |
| 2006/0071282 A1* | 4/2006 | Kadoshima et al. | 257/369 |
| 2006/0197157 A1* | 9/2006 | Koyama et al. | 257/351 |
| 2006/0263963 A1* | 11/2006 | Hu | 438/199 |
| 2007/0023842 A1* | 2/2007 | Jung et al. | 257/369 |

(Continued)

FOREIGN PATENT DOCUMENTS

CN    1812054    8/2006

OTHER PUBLICATIONS

Chinese Patent Office, Office Action dated Aug. 6, 2010; Application No. 200910173523.5, 4 pages.

*Primary Examiner* — Kimberly Rizkallah
*Assistant Examiner* — Maria Ligai
(74) *Attorney, Agent, or Firm* — Haynes and Boone, LLP (57) ABSTRACT

The present disclosure provides a method of fabricating a semiconductor device. The method includes providing a semiconductor substrate with a first region and a second region, forming a high-k dielectric layer over the semiconductor substrate, forming a metal layer over the high-k dielectric layer, the metal layer having a first work function, protecting the metal layer in the first region, treating the metal layer in the second region with a de-coupled plasma that includes carbon and nitrogen, and forming a first gate structure in the first region and a second gate structure in the second region. The first gate structure includes the high-k dielectric layer and the untreated metal layer. The second gate structure includes the high-k dielectric layer and the treated metal layer.

20 Claims, 7 Drawing Sheets

(56) References Cited

U.S. PATENT DOCUMENTS

| | | | |
|---|---|---|---|
| 2007/0037335 A1* | 2/2007 | Chambers et al. | 438/197 |
| 2007/0278584 A1* | 12/2007 | Colombo et al. | 257/369 |
| 2007/0284676 A1* | 12/2007 | Alshareef et al. | 257/412 |
| 2008/0050898 A1* | 2/2008 | Luan | 438/585 |
| 2008/0242068 A1* | 10/2008 | Kurahashi et al. | 438/542 |
| 2009/0035927 A1* | 2/2009 | Olsen et al. | 438/585 |
| 2010/0025778 A1* | 2/2010 | Lai et al. | 257/407 |

* cited by examiner

METHOD OF FORMING A SINGLE METAL THAT PERFORMS N AND P WORK FUNCTIONS IN HIGH-K/METAL GATE DEVICES

PRIORITY DATA

This application claims priority to Provisional Application Ser. No. 61/096,989 filed on Sep. 15, 2008, entitled "METHOD OF FORMING A SINGLE METAL THAT PERFORMS N AND P WORK FUNCTIONS IN HIGH-K/METAL GATE DEVICES", the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

During the scaling trend, various materials have been implemented for the gate electrode and gate dielectric for CMOS devices. There has been a desire to fabricate these devices with a metal material for the gate electrode and a high-k dielectric for the gate dielectric. However, an n-type MOS device (NMOS) and a p-type MOS device (PMOS) require different work functions for their respective gate electrode. Several approaches have been implemented to achieve N and P work functions, simultaneously, for the metal gates. One approach uses multiple metal and/or cap layers for the gate stack to achieve both N and P work functions. Although this approach has been satisfactory for its intended purpose, it has not been satisfactory in all respects. For example, the approach increases the complexity of the gate stack in the NMOS and PMOS devices, and thus increases the difficulty of patterning the gate stack.

Accordingly, what is needed is a method for forming a single metal that performs both N work function and P work function in a high-k/metal gate process.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
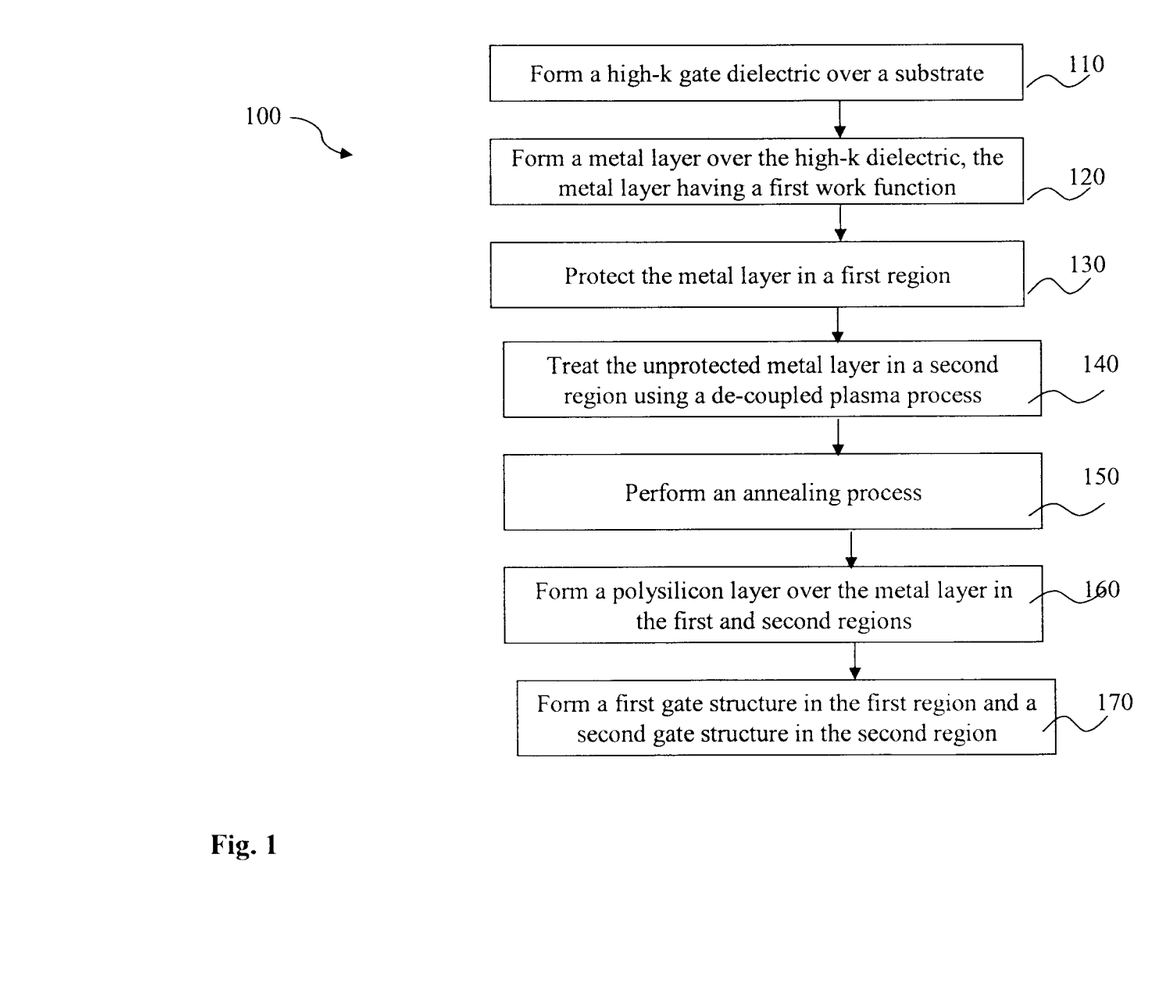
FIG. 1 is a flowchart illustrating a method for fabricating a semiconductor device in a high-k/metal gate process according to various aspects of the present disclosure.

Illustrated in FIG. 1 is a flowchart of a method 100 for fabricating a semiconductor device in a high-k/metal gate process. FIGS. 2A to 2F illustrate cross-sectional views of one embodiment of a semiconductor device 200 at various stages of fabrication according to the method 100 of FIG. 1. Also, it should be noted that part of the method 100 of FIG. 1 may be implemented with a CMOS process flow. Accordingly, it is understood that additional processes may be provided, before, during, and after the method 100, and that some processes may be briefly described herein. Further, it is understood that FIGS. 2A to 2F have been simplified for a better understanding of the inventive concepts of the present disclosure.

Figure 2A:
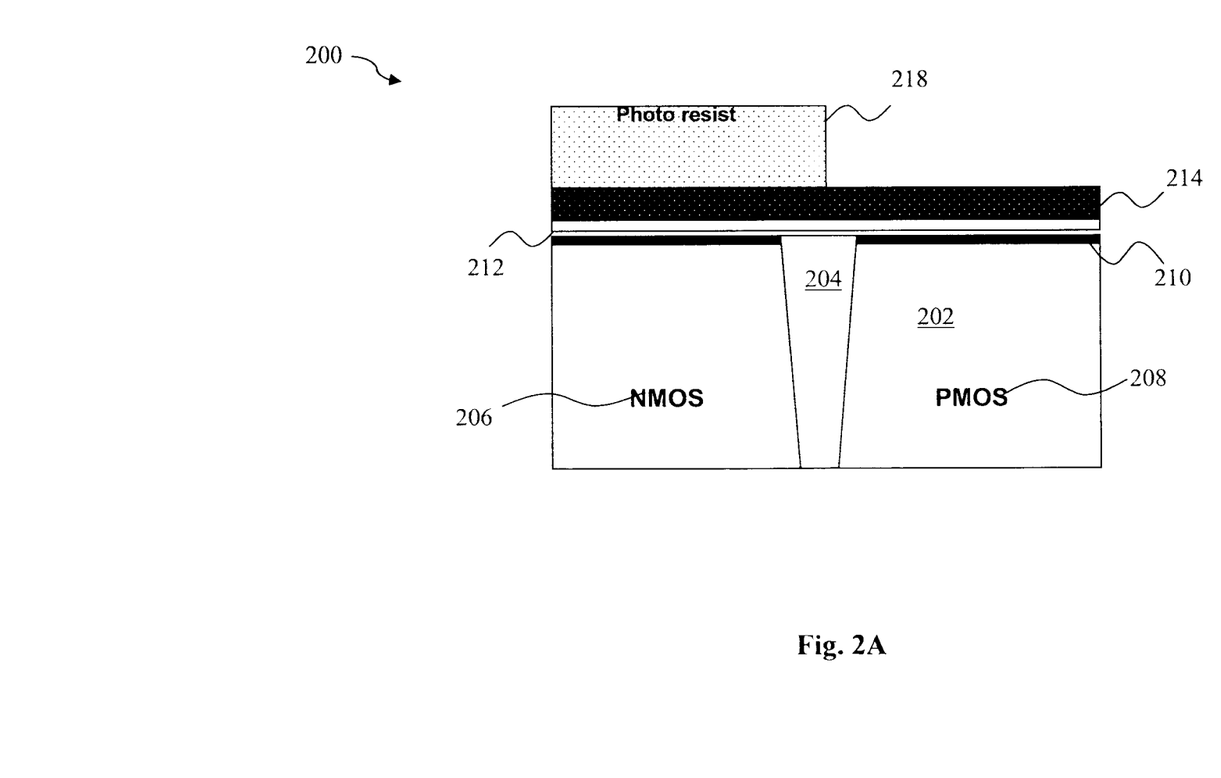
FIGS. 2A to 2F are cross-sectional views of a semiconductor device at various stages of fabrication according to the method of FIG. 1.

Referring to FIG. 1, the method 100 begins with block 110 in which a high-k dielectric material may be formed over a semiconductor substrate. Referring also to FIG. 2A, the semiconductor device 200 includes the semiconductor substrate 202 such as a silicon substrate. The substrate 202 may include various doping configurations depending on design requirements as is known in the art. The substrate 202 may also include other elementary semiconductors such as germanium and diamond. Alternatively, the substrate 202 may include a compound semiconductor and/or an alloy semiconductor. Further, the substrate 202 may optionally include an epitaxial layer (epi layer), may be strained for performance enhancement, and may include a silicon-on-insulator (SOI) structure.

The semiconductor device 200 may further include an isolation structure 204 such as a shallow trench isolation (STI) feature formed in the substrate 202 for isolating active regions 206 and 208 in the substrate. The isolation structure 204 may be formed of silicon oxide, silicon nitride, silicon oxynitride, fluoride-doped silicate (FSG), and/or a low k dielectric material known in the art. The active region 206 may be configured for an N-type metal-oxide-semiconductor transistor device (referred to as NMOS) and the active region 208 may be configured for a P-type MOS transistor device (referred to as PMOS). It is understood part of the semiconductor device 200 may be fabricated by a complementary MOS (referred to as CMOS) technology processing, and thus some processes are not described in detail herein.

The semiconductor device 200 may further include an interfacial layer 210 formed over the substrate 202. The interfacial layer 210 may include a grown silicon oxide layer having a thickness ranging from about 5 to 10 angstrom (A). The semiconductor device 200 may further include a high-k dielectric layer 212 formed on the interfacial layer 210. The high-k dielectric layer 212 may include hafnium oxide (HfO$_2$). Alternatively, the high-k dielectric layer 212 may optionally include other high k dielectric materials such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof. The high-k dielectric layer 212 may be formed by atomic layer deposition (ALD), chemical vapor deposition (CVD), or other suitable technique. The high-k dielectric layer 212 may have a thickness ranging from 10 to about 30 angstrom (A).

The method 100 continues with block 120 in which a metal layer may be formed over the high-k dielectric layer, the metal layer having a first work function. The semiconductor device 200 may further include a metal layer 214 formed over the high-k dielectric layer 212. The metal layer 214 may include an N work function metal (N-metal). For example, the metal layer 214 may include various metals that have a work function that is less than about 4.33 eV. In the present embodiment, the metal layer 214 may include Ta. Alternatively, some other examples of N-metals may include (but are not limited to) Zn, Ti, Nb, Al, Ag, Mn, Zr, Hf, and La. The metal layer 214 may be formed by various deposition techniques such as physical vapor deposition (PVD or sputtering), CVD, ALD, plating, or other suitable technique. The metal layer 214 may have a thickness that is greater than about 25 angstrom (A). In present embodiment, the metal layer 214 may have a thickness ranging from about 40 to about 60 angstrom (A), preferably about 50 angstrom (A).

The method 100 continues with block 130 in which a patterned mask layer may be formed to protect the metal layer in a first region. In the present embodiment, a patterned photoresist layer 218 may be formed the metal layer 214n in the NMOS device 206. The patterned photoresist layer 218 may be formed by photolithography, immersion lithography, ion-beam writing, or other suitable process. For example, the photolithography process may include spin coating, soft-baking, exposure, post-baking, developing, rinsing, drying, and other suitable process. Alternatively, a patterned hard mask layer may be formed to protect the metal layer 214n in the NMOS device 206 side instead of the photoresist layer. The hard mask layer may be formed of silicon oxide, silicon oxynitride, silicon nitride, or other suitable material. The hard mask may be patterned by first forming a patterned photoresist layer over the hard mask layer, and then dry or wet etching to remove a portion of the hard mask layer in the PMOS region 208 side.

Figure 2B:
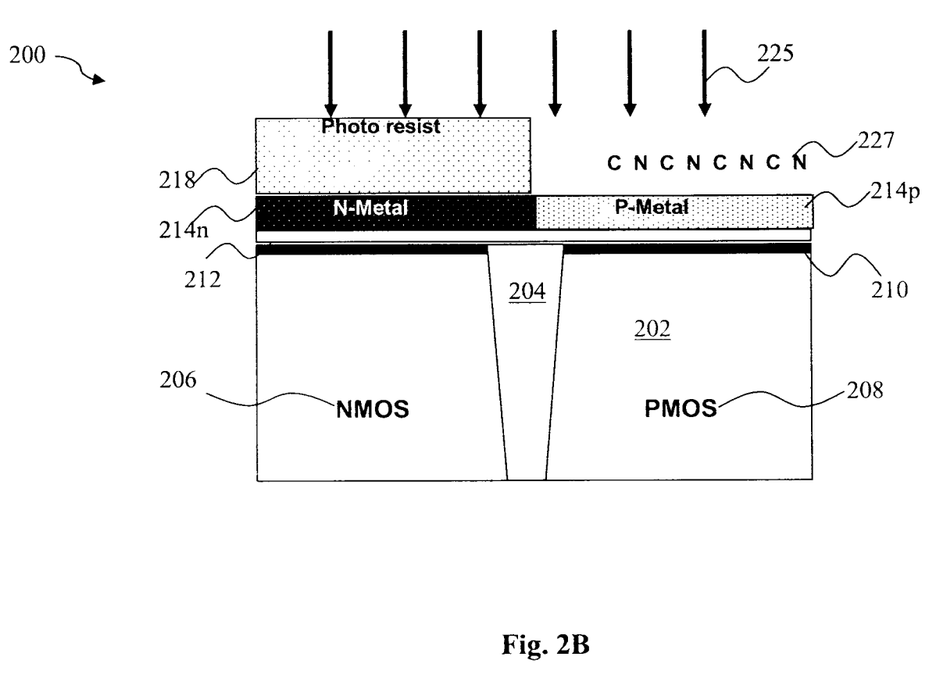

Referring also to FIG. 2B, the method 100 continues with block 140 in which the unprotected metal layer in a second region may be treated with a de-coupled plasma process. In the present example, the unprotected metal layer 214p may be treated with a de-coupled plasma process 225 that incorporates elements 227 into a top portion of the metal layer 214p such that the work function of the metal layer 214p transforms (or adjusts) from an N-metal into a P work function metal (P-metal). The various elements 227 that may be incorporated include C, N, Si, O, or combinations thereof to achieve the desired work function. In the present embodiment, the layer of Ta may be carbonated and nitrided by the de-coupled plasma process 225 to transform the Ta layer into a TaCN layer which performs as a P-metal. In various embodiments, the P-metal may include a work function that is greater than about 4.8 eV. The de-coupled plasma process 225 may be tuned so that the elements 227 are incorporated in a region at least 5 angstrom (A) away from an interface between the metal layer 214p and the high-k dielectric layer 212. Accordingly, the risk of damaging the high-k dielectric layer 212 may be reduced or avoided. Further, the protected metal layer 214n in the NMOS device 206 side remains unchanged as an N-metal. Thus, a single metal layer may be provided that performs as both an N-metal and P-metal.

The de-coupled plasma process 225 may include the following process parameters for a de-coupled plasma tool: N2 (or other containing gases containing nitrogen (N)) gas flow greater than about 100 sccm, C2H2 (or CH4 or other gases containing carbon (C)) gas flow greater than about 100 sccm, RF power greater than about 500 W (continuous or pulsed RF), pressure greater than about 10 mTorr, and time period ranging from about 15 to about 120 seconds. It should be noted that the de-coupled plasma process 225 may provide a high ion density but low ion energy plasma to incorporate elements 227 into the top interface of the metal layer 214p without penetrating too deep and possibly degrading the underlying high-k dielectric layer 212. This is important since the thickness of the metal layer 214 is about 50 angstrom (A). It is understood that the various parameters disclosed above are mere examples, and that these parameters may be tuned to achieve the desired work function without departing from the spirit and scope of the present disclosure. For example, it has been observed that increasing the RF power and pressure of the de-coupled plasma tool may create a high ion density but low ion energy plasma for modifying the metal profile more at the top interface.

The method 100 continues with block 150 in which an annealing process may be performed. The annealing process may be performed at a temperature ranging from about 800 to about 1000 degree C. The annealing process may include a rapid thermal annealing (RTA), laser annealing, or other suitable process. The annealing process may secure the concentration of C and N elements in the metal layer 214p of the PMOS device 208 to stabilize the work function of the P-metal. Accordingly, the annealing process may promote the bonding of the C and N elements in the metal layer 214p. The annealing process may be performed in a compatible environment with the incorporated elements such as an N2 environment.

Figure 2C:
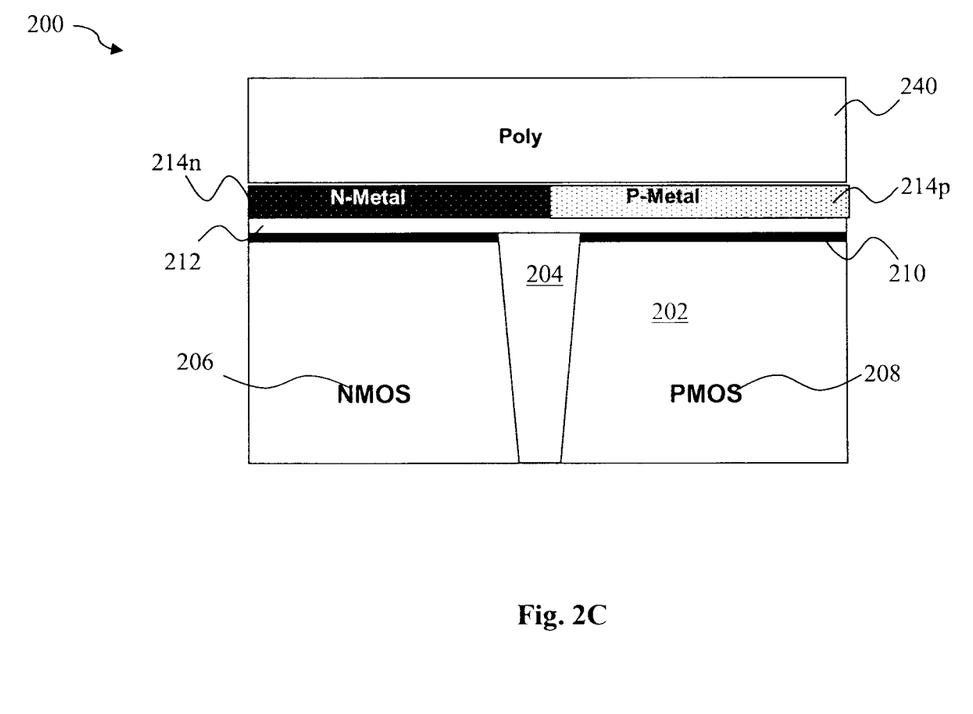

Referring also to FIG. 2C, the method 100 continues with block 160 in which a polysilicon layer may be formed over the metal layer in the first and second regions. The patterned photoresist layer 118 may be removed by a stripping process or other suitable process. A polysilicon (or poly) layer 240 may be formed over the N-metal layer 214n and the P-metal layer 214p by CVD or other suitable deposition process. The polysilicon layer 240 may include a thickness ranging from 200 to about 2000 angstrom (A).

Figure 2D:
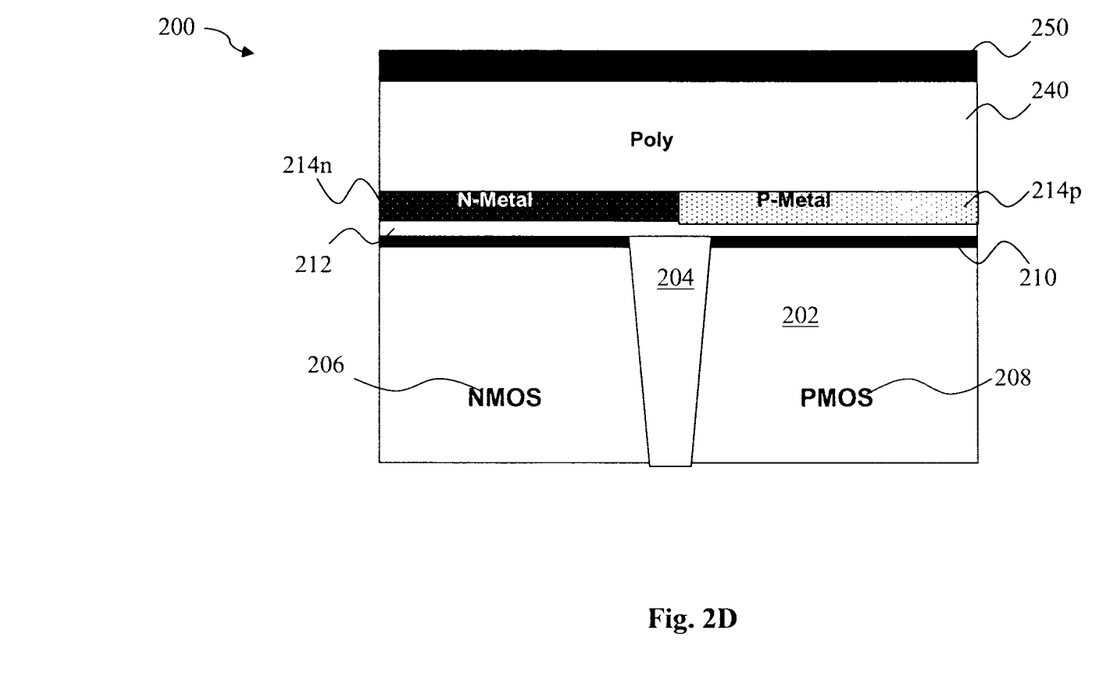

Referring also to FIG. 2D, a hardmask layer 250 may then be formed over the poly layer 240. The hard mask layer 250 may include SiN, SiON, SiC, SiOC/PEOX, TEOS, or other suitable material. Additionally, an anti-reflective coating (ARC) or bottom anti-reflective coating (BARC) may be formed on the hard mask layer 250 as is known in the art.

Figure 2E:
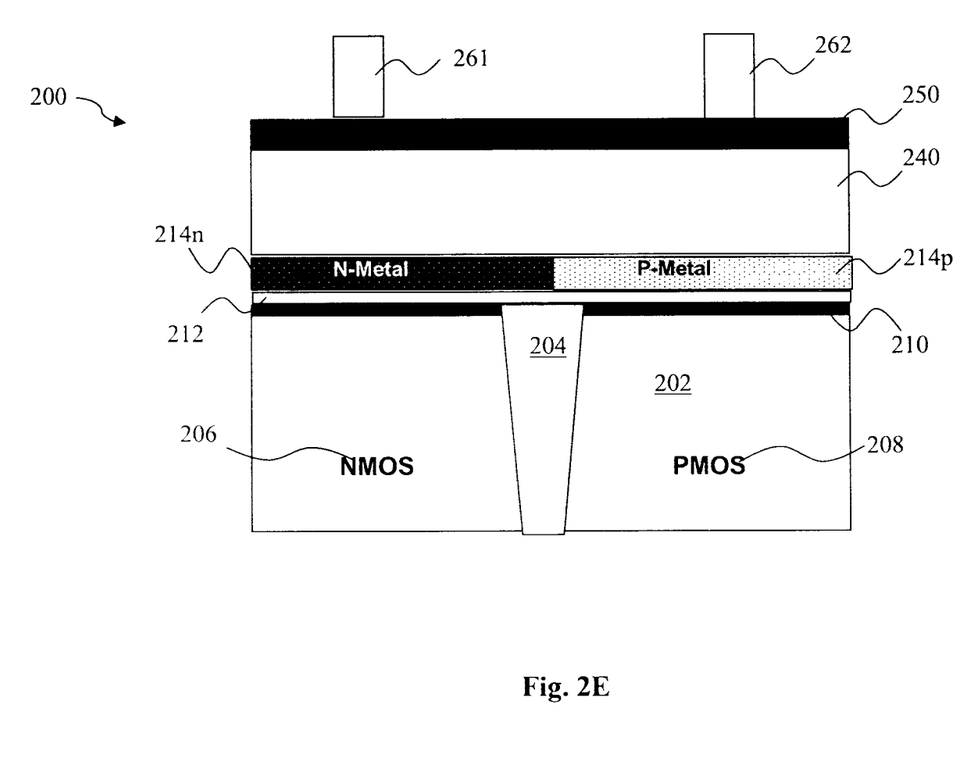

Referring also to FIG. 2E, a patterned photoresist layer may be formed on the hard mask layer 250. The patterned photoresist layer may include a gate pattern 261 for the NMOS device 206 and a gate pattern 262 for the PMOS device 208. The gate patterns 261, 262 may be formed by photolithography, immersion lithography, or other suitable process.

Figure 2F:
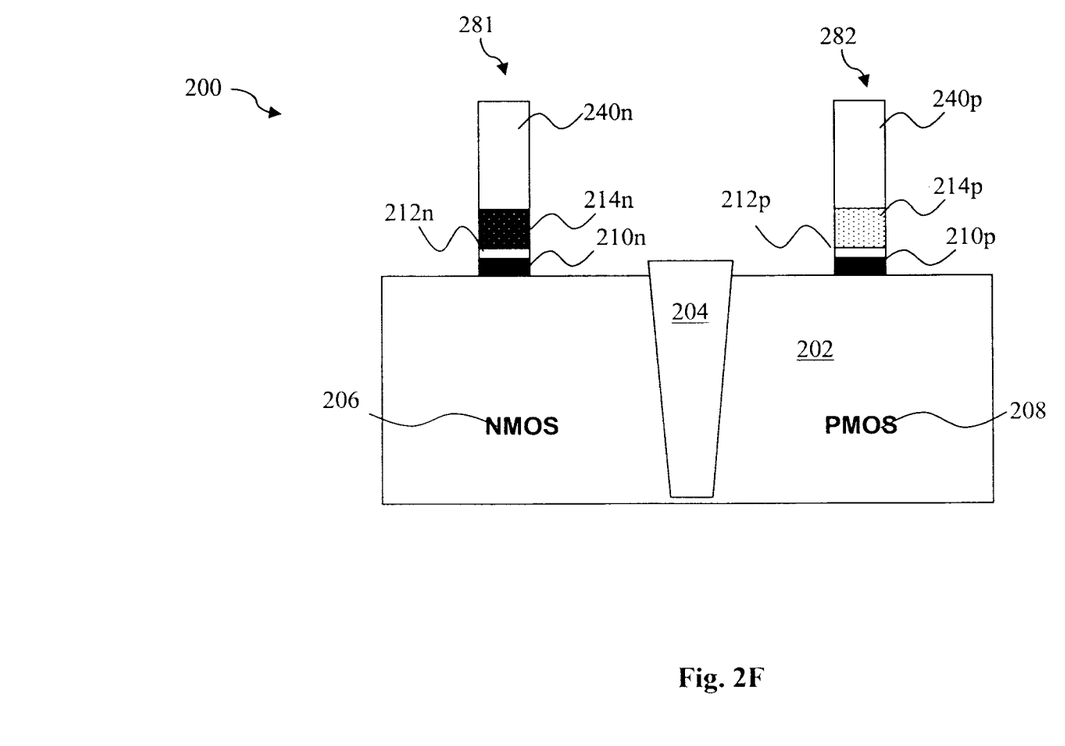

The method 100 continues with block 170 in which a first gate structure may be formed in the first region and a second gate structure may be formed in the second region. Referring also to FIG. 2F, the hard mask layer 250 may be patterned by a dry or wet etching process using the gate patterns 261, 262 as a mask, and the patterned hard mask layer may be used to pattern a gate structure 281 in the NMOS device 206 and a gate structure 282 in the PMOS device 208. The gate structures 281, 282 may be formed by a dry or wet etching process (e.g., gate etching or patterning). The gate patterns 261, 262 and the patterned hard mask layer may be removed by a suitable process known in the art.

The gate structure 281 in the NMOS device 206 may include a poly layer 240n, an N-metal 214n, a high-k dielectric 212n, and an interfacial layer 210n. The gate structure 282 in the PMOS device 208 may include a poly layer 240p, a P-metal 214p, a high-k dielectric 212p, and an interfacial layer 210p. It should be noted that prior to the gate patterning, the N-metal layer 214n and the P-metal layer 214p may have a similar thickness, and thus gate patterning in the NMOS device 206 and the PMOS device 208 becomes less difficult as compared to pattering gate structures with varying thicknesses for NMOS and PMOS devices or to patterning metal gates for NMOS and PMOS devices in a gate last process.

It is understood that the method 200 may continue with further processing of the semiconductor device 200 in a CMOS technology process flow to form various features as is known in the art. For example, lightly doped source/drain regions (LDD regions) may be formed on either side of the gate structures 281, 282 by an ion implantation process as is known in the art. Further, sidewall or gate spacers may be formed on the sides of the gate structures 281, 282 by a deposition and etching process as is known in the art. The gate spacers may include a suitable dielectric material such as silicon nitride, silicon oxide, silicon carbide, silicon oxynitride, or combinations thereof. Additionally, source and drain regions (referred to as S/D regions) may be formed on either side of the gate structures 281, 282 using ion implantation or diffusion with suitable N-type or P-type dopants (depending on the configuration of the device such as NMOS and PMOS).

Moreover, various contacts/vias, metal structures, and multilayer interconnect features (e.g., metal layers and interlayer dielectric) may be formed on the substrate and configured to connect the various features or structures of the semiconductor device 200. For example, silicide features may be formed by silicidation such as self-aligned silicide (salicide) in which a metal material is formed next to Si structure, then the temperature is raised to anneal and cause reaction between underlying silicon and the metal to form silicide, and un-reacted metal is etched away. The salicide material may be self-aligned to be formed on various features such as the source region, drain region and/or gate electrode to reduce contact resistance. Also, a plurality of patterned dielectric layers and conductive layers are formed on the substrate to form multilayer interconnects configured to couple the various p-type and n-type doped regions, such as the source, drain region, contact region, and gate electrode. In one embodiment, an interlayer dielectric (ILD) and a multilayer interconnect (MLI) structure are formed in a configuration such that the ILD separates and isolates each from other of the MLI structure. In furtherance of the example, the MIL structure includes contacts, vias and metal lines formed on the substrate.

Thus, the present disclosure provide a method of fabricating a semiconductor device that includes providing a semiconductor substrate with a first region and a second region, forming a high-k dielectric layer over the semiconductor substrate, forming a metal layer over the high-k dielectric layer, the metal layer having a first work function, protecting the metal layer in the first region, treating the metal layer in the second region with a de-coupled plasma that includes carbon (C) and nitrogen (N), and forming a first gate structure in the first region and a second gate structure in the second region. The first gate structure includes the high-k dielectric layer and the metal layer. The second gate structure includes the high-k dielectric layer and the treated metal layer. In some embodiments, the de-coupled plasma treatment includes an RF power greater than 500 W, a pressure greater than 10 mTorr, a gas containing nitrogen (N) with a flow rate greater than 100 sccm, a gas containing carbon (C) with a flow rate greater than 100 sccm, and a time period ranging from about 15 to 120 seconds. In some other embodiments, the gas containing N includes N2. In other embodiments, the gas containing carbon includes C2H2 or CH4. In some other embodiments, the first work function includes an N work function metal. In other embodiments, the first metal layer includes Ta.

In still other embodiments, the method further includes performing an annealing process after the treatment, the annealing process including a temperature ranging from about 800 to about 1000 degree C. In some embodiments, the method further includes forming an interfacial layer between the substrate and the high-k dielectric layer and forming a polysilicon layer over the untreated metal layer in the first region and over the treated metal layer in the second region. In some other embodiments, the high-k gate dielectric layer includes hafnium oxide, hafnium silicon oxide, hafnium silicon oxynitride, hafnium tantalum oxide, hafnium titanium oxide, hafnium zirconium oxide, or combinations thereof. In other embodiments, the first gate structure is part of an NMOS device and wherein the second gate structure is part of a PMOS device.

Also provided is a semiconductor device that includes a semiconductor substrate, an isolation structure formed in the substrate for isolating a first region and a second region, a first transistor formed in the first region, the first transistor having a first gate structure that includes an interfacial layer, a high-k dielectric layer, and a metal layer, and a second transistor formed in the second region, the second transistor having a second gate structure that includes the interfacial layer, the high-k dielectric layer, and the metal layer that is incorporated with at least two elements, the at least two elements being at least 5 angstrom away from an interface between the high-k dielectric layer and the metal layer, the at least two elements transforming the metal layer from a first-type work function metal to a second-type work function metal. In some embodiments, the first work function includes an N work function metal and the second work function includes a P work function metal. In other embodiments, the metal layer includes Ta. In still other embodiments, the at least two elements include carbon and nitrogen. In some other embodiments, the metal layer includes a thickness ranging from about 40 to about 60 angstrom.

Further, a method for fabricating a semiconductor device is provided which includes providing a semiconductor substrate having a first region and a second region, forming a high-k dielectric layer over the semiconductor substrate, forming an N work function metal (N-metal) layer over the high-k dielectric layer, treating the N-metal layer overlying the second region with a de-coupled plasma such that at least two elements are incorporated into the N-metal layer, the at least two elements being at least 5 angstrom away from an interface between the high-k dielectric layer and the N-metal layer, performing an annealing process, forming a polysilicon layer over the N-metal layer overlying the first region and over the treated N-metal layer overlying the second region, and forming a first gate structure over the first region and a second gate structure over the second region. The first gate structure includes the high-k dielectric layer, the N-metal layer, and the polysilicon layer In some embodiments, the at least two element include carbon (C), nitrogen (N), silicon (Si), or oxygen (O). In other embodiments, the de-coupled plasma treatment includes an RF power greater than 500 W, a pressure greater than 10 mTorr, a gas containing nitrogen (N) with a flow rate greater than 100 sccm, a gas containing carbon (C) with a flow rate greater than 100 sccm, and a time period ranging from about 15 to 120 seconds. In some other embodiments, the N-metal layer includes Ta. In still other embodiments, the gas containing nitrogen includes N2. In some embodiments, the gas containing carbon includes C2H2 or CH4. In yet other embodiments, the N-metal layer includes La, Hf, Zr, Al, or Ti.

The present invention achieves different advantages in various embodiments. For example, the present disclosed method provides a simple and cost-effective single metal layer that performs both N-metal work function and P-metal work function for NMOS and PMOS devices, respectively. Accordingly, patterning the gate structures for NMOS and PMOS devices becomes easier since the corresponding gate stacks have a similar thickness. Accordingly, performance of the NMOS and PMOS devices may become more reliable and predictable. Also, the methods disclosed herein are compatible with current CMOS technology process flow, and thus can easily be integrated with current processing equipment and device technologies. It is understood that different embodiments disclosed herein offer several different advantages, and that no particular advantage is necessarily required for all embodiments.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, although the embodiments have been described herein with respect to transforming an N-metal into a P-metal, the methods disclosed herein may also be applicable for transforming a P-metal into an N-metal. Further, it is understood that the semiconductor devices disclosed herein are not limited to a specific transistor and may include other active and passive devices such as a finFET transistor, a high voltage transistor, a bipolar junction transistor (BJT), a capacitor, a resistor, a diode, a fuse, or combinations thereof.

What is claimed is:

1. A method of fabricating a semiconductor device comprising:
   providing a semiconductor substrate with a first region and a second region;
   forming a high-k dielectric layer over the semiconductor substrate;
   forming a metal layer over the high-k dielectric layer, the metal layer having a first work function;
   protecting the metal layer in the first region by forming a mask over the metal layer in the first region, the mask being a photoresist mask;
   treating the unprotected metal layer in the second region with a de-coupled plasma process that includes carbon, nitrogen, and silicon, wherein the treating the unprotected metal layer in the second region with the de-coupled plasma includes incorporating the carbon, nitrogen, and silicon into the unprotected metal layer without the carbon, nitrogen, and silicon penetrating to a bottom surface of the unprotected metal layer, the bottom surface of the unprotected metal layer physically contacting the high-k dielectric layer, wherein the unprotected metal layer has a top surface facing away from the semiconductor substrate and opposing the bottom surface such that a thickness of the unprotected metal layer is measured from the bottom surface to the top surface of the unprotected metal layer, wherein after treating the unprotected metal layer in the second region with the de-coupled plasma process the unprotected metal layer includes a region extending from the bottom surface of the unprotected metal layer toward the top surface of the unprotected metal layer that is free of the carbon, nitrogen, and silicon incorporated into the unprotected metal layer via the de-coupled plasma process, wherein the region extends away from the bottom surface by at least 10% of the thickness of the unprotected metal layer;
   performing an annealing process on the treated unprotected metal layer and the protected metal layer having the mask there over in the first region to secure the carbon and nitrogen into the treated unprotected metal layer;
   forming a polysilicon layer over the metal layer in the first region and over the treated metal layer in the second region;
   forming a hard mask layer over the polysilicon layer in the first and second regions;
   forming a patterned photoresist layer over the hard mask layer in the first and second regions; and
   thereafter forming a first gate structure in the first region and a second gate structure in the second region, the first gate structure including the high-k dielectric layer and the metal layer, the second gate structure including the high-k dielectric layer and the treated metal layer.

2. The method of claim 1, wherein the de-coupled plasma treatment includes an RF power greater than 500 W, a pressure greater than 10 mTorr, a gas containing nitrogen with a flow rate greater than 100 sccm, a gas containing carbon with a flow rate greater than 100 sccm, and a time period ranging from about 15 to 120 seconds.

3. The method of claim 2, wherein the gas containing nitrogen includes $N_2$.

4. The method of claim 2, wherein the gas containing carbon includes $C_2H_2$ or $CH_4$.

5. The method of claim 1, wherein the first work function includes an N-type work function metal.

6. The method of claim 5, wherein the first metal layer includes Ta.

7. The method of claim 1, wherein the annealing process includes a temperature ranging from about 800 to about 1000 degree C.

8. The method of claim 1, further comprising:
   forming an interfacial layer between the semiconductor substrate and the high-k dielectric layer; and
   wherein the first and second gate structures each further includes the interfacial layer and the polysilicon layer.

9. The method of claim 1, wherein the first gate structure is part of an NMOS device and the second gate structure is part of a PMOS device.

10. The method of claim 1, wherein the high-k dielectric layer includes hafnium oxide, hafnium silicon oxide, hafnium silicon oxynitride, hafnium tantalum oxide, hafnium titanium oxide, hafnium zirconium oxide, or combinations thereof.

11. The method of claim 1, wherein the hard mask layer includes SiC.

12. The method of claim 1, wherein the thickness of the unprotected metal layer is about 50 angstroms and wherein the region extends away from the bottom surface toward the top surface by at least 5 angstroms.

13. A method for fabricating a semiconductor device, the method comprising:
provoding a semiconductor substrate having a first region and a second region;
forming a high-k dielectric layer over the semiconductor substrate;
forming an N-type work function metal (N-metal) layer over the high-k dielectric layer;
forming a photoresist mask over the N-metal layer in the first region to protect the N-metal layer in the first region;
treating the N-metal layer overlying the second region with a de-coupled plasma process that includes at least silicon and carbon and one of nitrogen and oxygen such that the at least silicon and carbon and one of nitrogen and oxygen are incorporated into the N-metal layer overlying the second region without the at least silicon and carbon and one of nitrogen and oxygen penetrating to a bottom surface of the N-metal layer, the bottom surface of the N-metal layer physically contacting the high-k dielectric layer, wherein the N-metal layer has a top surface facing away from the semiconductor substrate and opposing the bottom surface such that a thickness of the N-metal layer is measured from the bottom surface to the top surface of the N-metal layer, wherein after treating the N-metal layer overlying the second region with the de-coupled plasma process the N-metal layer includes a region extending from the bottom surface of the N-metal layer toward the top surface of the N-metal layer that is free of the at least silicon and carbon and the one of nitrogen and oxygen incorporated into the N-metal layer via the de-coupled plasma process, wherein the region extends away from the bottom surface by at least 10% of the thickness of the N-metal layer;
performing an annealing process on the treated N-metal layer and the protected N-metal layer having the photoresist mask there over in the first region to secure the carbon into the treated N-metal layer;
forming a polysilicon layer over the N-metal layer overlying the first region and over the treated N-metal layer overlying the second region;
forming a hard mask layer directly on the polysilicon layer in the first and second regions;
forming a patterned photoresist layer directly on the hard mask layer in the first and second regions; and
forming a first gate structure over the first region and a second gate structure over the second region, the first gate structure including the high-k dielectric layer, the N-metal layer, and the polysilicon layer, the second gate structure including the high-k dielectric layer, the treated N-metal layer, and the polysilicon layer, wherein the first and second gate structures are formed after performing the annealing process.

14. The method of claim 13, wherein silicon, carbon, nitrogen, and oxygen are incorporated into the N-metal layer overlying the second region by the de-coupled plasma.

15. The method of claim 13, wherein the N-metal layer includes Ta.

16. The method of claim 15, wherein the de-coupled plasma treatment includes an RF power greater than 500 W, a pressure greater than 10 mTorr, a gas containing nitrogen (N) with a flow rate greater than 100 sccm, a gas containing carbon (C) with a flow rate greater than 100 sccm, and a time period ranging from about 15 to about 120 seconds.

17. The method of claim 13, wherein the N-metal layer includes La, Hf, Zr, Al, or Ti.

18. A method of fabricating a semiconductor device comprising:
providing a semiconductor substrate having a first and second region;
forming a high-k dielectric layer over the semiconductor substrate;
forming a metal layer over the high-k dielectric layer;
protecting the metal layer in the first region by forming a mask over the metal layer in the first region, the mask being a photoresist mask;
treating the unprotected metal layer in the second region with a de-coupled plasma process that includes at least silicon and carbon and one of nitrogen and oxygen, wherein the treating the unprotected metal layer in the second region with the de-coupled plasma includes incorporating the at least silicon and carbon and one of nitrogen and oxygen into the unprotected metal layer without the at least silicon and carbon and one of nitrogen and oxygen penetrating to a bottom surface of the unprotected metal layer, the bottom surface of the unprotected metal layer physically contacting the high-k dielectric layer, wherein the unprotected metal layer has a top surface facing away from the semiconductor substrate and opposing the bottom surface such that a thickness of the unprotected metal layer is measured from the bottom surface to the top surface of the unprotected metal layer, wherein after treating the unprotected metal in the second region with the de-coupled plasma process the unprotected metal layer includes a region extending from the bottom surface of the unprotected metal layer toward the top surface of the unprotected metal layer that is free of the at least silicon and carbon and the one of nitrogen and oxygen incorporated into the unprotected metal layer via the de-coupled plasma process, wherein the region extends away from the bottom surface by at least 10% of the thickness of the unprotected metal layer;
performing an annealing process on the treated unprotected metal layer and the protected metal layer having the mask there over to secure the carbon into the treated unprotected metal layer;
forming a polysilicon layer over the metal layer in the first region and over the treated metal layer in the second region;
forming a hard mask layer directly on the polysilicon layer in the first and second regions;
forming a patterned photoresist layer directly on the hard mask layer in the first and second regions; and
after the annealing process, a gate structure including the high-k dielectric layer and the treated metal layer.

19. The method of claim 18, wherein the metal layer includes an N-type work function metal.

20. The method of claim 18, wherein the metal layer includes Zn.

* * * * *